(12) United States Patent
Wang et al.

(10) Patent No.: US 7,977,666 B2
(45) Date of Patent: Jul. 12, 2011

(54) QUANTUM DOT INFRARED PHOTODETECTOR APPARATUS

(75) Inventors: Shiang-Yu Wang, Taipei (TW);
Hong-Shi Ling, Kaohsiung (TW);
Ming-Cheng Lo, Taipei County (TW);
Chien-Ping Lee, Hsin Chu (TW)

(73) Assignee: Academia Sinica, Taipei (TW)

( * ) Notice: Subject to any disclaimer, the term of this patent is extended or adjusted under 35 U.S.C. 154(b) by 321 days.

(21) Appl. No.: 12/453,088

(22) Filed: Apr. 29, 2009

(65) Prior Publication Data
US 2010/0117060 A1      May 13, 2010

(30) Foreign Application Priority Data
Nov. 12, 2008   (TW) ................................ 97143612 A

(51) Int. Cl.
*H01L 29/06* (2006.01)
*H01L 31/0328* (2006.01)
*H01L 31/0336* (2006.01)
*H01L 31/072* (2006.01)
*H01L 31/109* (2006.01)

(52) U.S. Cl. ............. 257/21; 257/14; 257/15; 257/16; 257/17; 257/22; 257/E29.069; 257/E29.071; 257/E29.072; 257/E29.073; 257/E29.074; 257/E29.075; 257/E29.076; 257/E29.077; 257/E29.078; 257/E33.008; 977/759

(58) Field of Classification Search ............ 257/14, 257/15, 16, 17, 21, 22, E29.069, E29.071, 257/E29.072, E29.073, E29.074, E29.075, 257/E29.076, E29.077, E29.078, E33.008; 977/759

See application file for complete search history.

(56) References Cited

U.S. PATENT DOCUMENTS

| | | | | |
|---|---|---|---|---|
| 6,239,449 | B1 * | 5/2001 | Fafard et al. ................. | 257/17 |
| 6,445,000 | B1 * | 9/2002 | Masalkar et al. ............ | 257/21 |
| 7,473,922 | B2 * | 1/2009 | Uchiyama et al. ........... | 257/14 |
| 7,795,609 | B2 * | 9/2010 | Huffaker et al. ............. | 257/14 |
| 7,816,701 | B2 * | 10/2010 | Kim ............................. | 257/98 |
| 7,915,521 | B2 * | 3/2011 | Forrest et al. ................ | 136/255 |
| 2002/0094597 | A1 * | 7/2002 | Lin et al. ...................... | 438/57 |
| 2010/0176370 | A1 * | 7/2010 | Yokoyama et al. ........... | 257/13 |
| 2010/0224857 | A1 * | 9/2010 | Soh et al. ..................... | 257/13 |
| 2010/0224859 | A1 * | 9/2010 | Gough et al. ................. | 257/13 |
| 2010/0289001 | A1 * | 11/2010 | Kahen et al. ................. | 257/13 |
| 2010/0289061 | A1 * | 11/2010 | Matsukura ................... | 257/189 |
| 2011/0067752 | A1 * | 3/2011 | Fafard ......................... | 136/255 |

OTHER PUBLICATIONS

Ling et al., H. S., High Quantum Efficiency Dots-in-a-Well Quantum Dot Infrared Photodetectors with AlGaAs Confinement Enhancing Layer, Applied Physics Letters 92, Published online May 13, 2008, American Institute of Physics.

* cited by examiner

*Primary Examiner* — Ida M Soward
(74) *Attorney, Agent, or Firm* — Bacon & Thomas, PLLC

(57) ABSTRACT

The present invention is disclosed that a device capable of normal incident detection of infrared light to efficiently convert infrared light into electric signals. The device includes a substrate, a first contact layer formed on the substrate, an active layer formed on the first contact layer, a barrier layer formed on the active layer and a second contact layer formed on the barrier layer, wherein the active layer includes multiple quantum dot layers.

47 Claims, 4 Drawing Sheets

QUANTUM DOT INFRARED PHOTODETECTOR APPARATUS

BACKGROUND OF THE INVENTION

1. Field of the Invention

The invention relates to a photodetector apparatus, particularly to a quantum dot infrared photodetector apparatus.

2. Description of the Prior Art

In recent years, there are many researches associated with the development of quantum dot infrared photodetector, because it has the characteristics of low cost and high-temperature operation etc. The basic function of quantum dot infrared photodetector has been improved, and its performance has also been increased greatly.

Conventionally, quantum dot means that the nano-grade semiconductor raw materials having the narrower energy gap are imbedded into the semiconductor materials having the wide energy gap to form the quasi-zero-dimensional nanomaterial. The transitions of electrons among different states can be restrained by the quasi-zero-dimensional degree of freedom for electron state. Therefore,the quantum dot infrared photodetector formed by the quantum dot has the characteristics of low dark current, high responsivity and high-temperature operation etc.

In addition, the quantum dot infrared photodetector can absorb normal incident infrared due to three-dimensional bound states. The quantum dot infrared photodetector has the advantage of simplified manufacturing process compared to the quantum well infrared photodetector (QWIP) which cannot absorb normal incident light. And it is advantageous for the manufacturing of medium-wavelength (3 μm to 5 μm) photodetector because of larger energy gap difference of quantum dot structure. Thus, the development of quantum dot infrared photodetector is attracted a lot of interest by people. As for the quantum dot infrared photodetector technology, it was disclosed in "Applied Physics Letter 73, 963 (1998)" and "Applied Physics Letter 73, 3153 (1998)" These two prior papers disclosed the basic structure and embodiments of quantum dot infrared photodetector technology. Even the basic concept of quantum dot infrared photodetector technology had been revealed earlier in 1996, such as in the "Semiconductor Science Technology 11, 759 (1996)". It was also much earlier compared to the first patent disclosing quantum dot infrared photodetector technology as U.S. Pat. No. 6,239,449 "Quantum dot infrared photodetectors (QDIP)".

The early quantum dot infrared photodetector technology was limited by self-assembled quantum dot process. Thus, in order to solve the adjustment problem of the detecting wavelength, the dots-in-a-well structure was disclosed in "Applied Physics Letter 79, 3341 (2001)". In the dots-in-a-well structure, the thickness of quantum well could be employed to change the detecting wavelength, which was advantageous for the application of quantum dot infrared photodetector. However, the addition of quantum well structure would influence the quantum efficiency of the component.

Because of the above-mentioned reasons, the development of quantum dot infrared photodetector has been paid more attention day by day. In order to respond the future demand of photodetector technology, it is necessary to develop relevant technology of infrared photodetector, to reduce the manufacturing cost, manpower and time, and achieve the purpose of energy saving and carbon reduction effectively.

SUMMARY OF THE INVENTION

The present invention is disclosed that a device capable of normal incident detection of infrared light to efficiently convert infrared light into electric signals. The device comprises a substrate, a first contact layer formed on the substrate, a quantum dot active layer formed on the first contact layer, a barrier layer formed on the quantum dot active layer and finally a second contact layer formed on the barrier layer, wherein the active layer comprises a plurality of quantum dot layers. Wherein, the active layer comprises a first quantum well layer formed on the barrier layer, a quantum dot layer formed on the first quantum well layer, a confinement enhancing layer formed on the quantum dot layer, a second quantum well layer formed on the enhancement layer, and a barrier layer formed on the second quantum well layer.

Generally speaking, the quantum efficiency of quantum dot photodetector is less than 1%, and the invention can improve it by an order of magnitude to several percentages.

Compared to the existed prior art, the invention can raise the quantum efficiency to about 20 times.

The invention can increase the signal/noise ratio of detecting signal. It can raise the sensitivity of infrared detection under the same working temperature, or raise the working temperature under the same sensitivity.

The major application of the invention is used to detect the black body radiation of object itself, which means the object under room temperature can be detected without the existence of any light source.

The invention can improve the quantum dot structure in quantum well. The invention can add a high energy gap in quantum dot, so that the electrons in quantum dot will get a stronger quantum confinement effect. It can increase the infrared absorption efficiency of electrons, in order to improve the performance of device.

The advantage and spirit of the invention can be understood further by the following detailed description of invention and attached figures.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
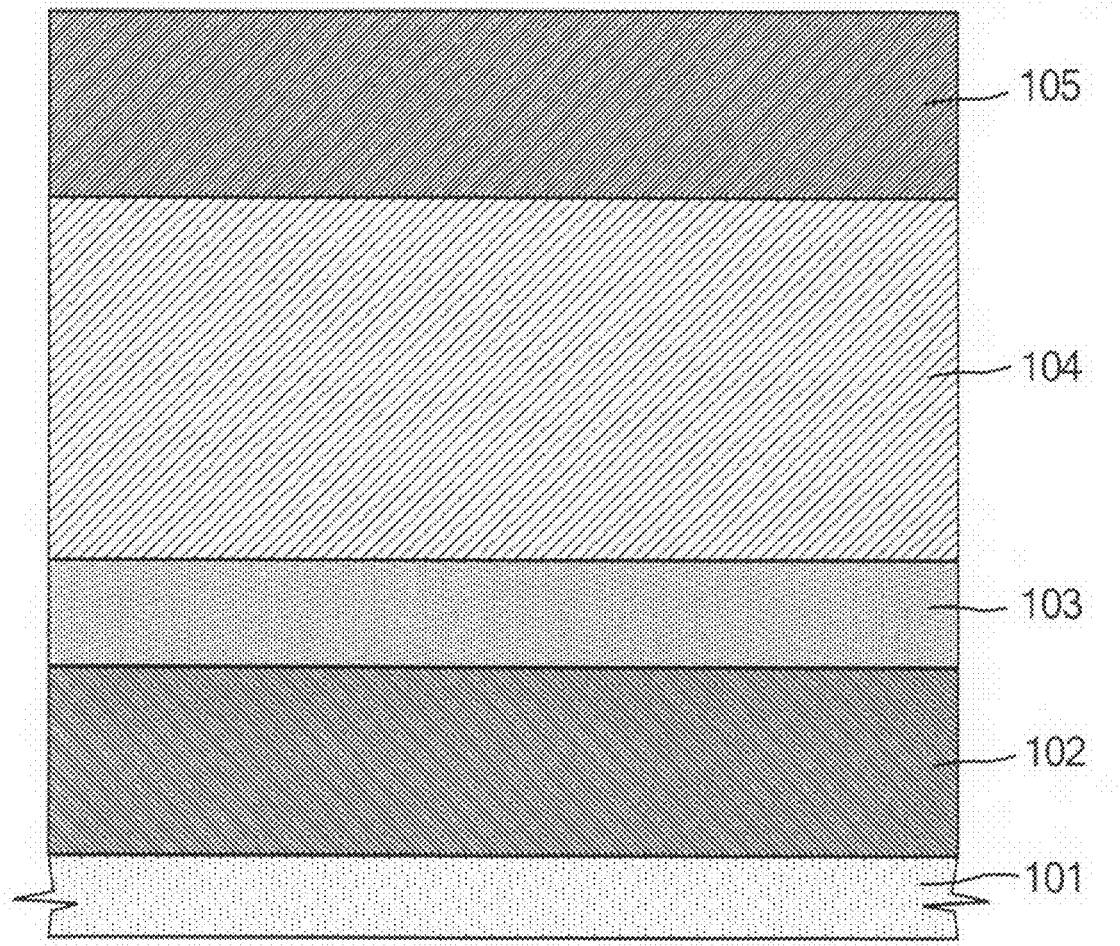
FIG. 1 shows a preferred embodiment of the invention.

The invention relates to a quantum dot infrared photodetector apparatus, which mainly comprises the following components:

As shown in FIG. 1, a semiconductor substrate 101 is provided, which is an undoped GaAs semiconductor substrate 101.

As shown in FIG. 1, a first contact layer 102 is provided, which is an $n^+$-type GaAs layer 102 doped with Group V element formed on the semiconductor substrate 101, and the thickness is about 500 nm.

As shown in FIG. 1, a barrier layer 103 is formed on the first contact layer 102. The barrier layer 103 is an undoped GaAs layer 103 or a AlGaAs layer 103, wherein the content of aluminum (Al) is 0% to 35%. The thickness of barrier layer 103 is about 10~150 nm. The thickness of barrier layer 103 is about 53 nm in the embodiment.

Then, as shown in FIG. 1, an active layer 104 is formed on the barrier layer 103.

Finally, as shown in FIG. 1, a second contact layer 105 is formed on the active layer 104, and the second contact layer is an n$^+$-type GaAs layer 105 doped with Group V element.

Figure 2:
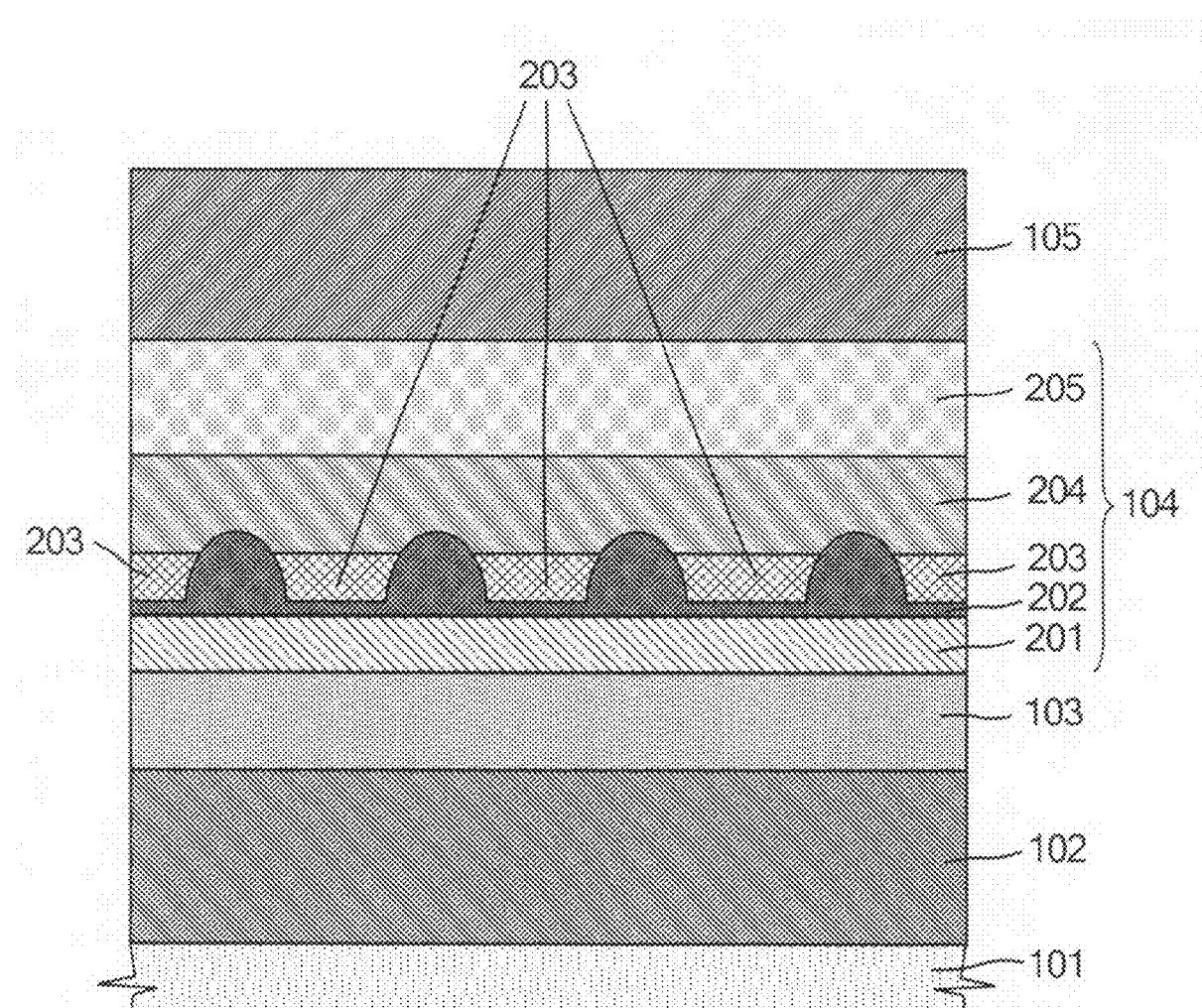
FIG. 2 shows a preferred embodiment of the quantum dot active layer of the invention.

The previous active layer 104 is piled by a quantum dot layer 104, thus the active layer 104 includes the followings:

As shown in FIG. 2, a first quantum well layer 201 is formed on the barrier layer 103, and then the first quantum well layer 201 is an undoped $In_{0.15}Ga_{0.85}As$ layer, wherein the content of indium (In) is about 0% to 20%. Normally, the thickness of the first quantum well layer 201 is about 0 nm to 15 nm, here the thickness of the first quantum well layer 201 is about 2 nm in the embodiment. As shown in FIG. 2, a quantum dot (In(Ga)As QD) layer 202 is formed on the first quantum well layer 201, and the density of quantum dot (In(Ga)As QD) layer 202 shall be larger than $1 \times 10^9 cm^{-2}$.

As shown in FIG. 2, a confinement enhancing layer 203 is formed on the quantum dot layer 202. The confinement enhancing layer 203 is an undoped $Al_{0.3}Ga_{0.7}As$ layer 203, wherein the content of aluminum (Al) can be 0% to 35%. The thickness of the confinement enhancing layer 203 is about 2 nm to 5 nm. The thickness of the confinement enhancing layer 203 is about 2.5 nm in the embodiment.

As shown in FIG. 2, a second quantum well layer 204 is formed on the confinement enhancing layer 203. The second quantum well layer 204 is an undoped $In_{0.15}Ga_{0.85}As$ layer 204, wherein the content of indium (In) can be 0% to 20%. The thickness of the second quantum well layer 204 is about 0 nm to 15 nm. The thickness of the second quantum well layer 204 is about 4.5 nm in the embodiment.

As shown in FIG. 2, a barrier layer 205 is formed on the second quantum well layer 204. The barrier layer 205 is an undoped GaAs layer 205 or AlGaAs layer 205. The thickness of the barrier layer 205 is about 10~150 nm. The thickness of the barrier layer 205 is about 53 nm in the embodiment.

Figure 3:
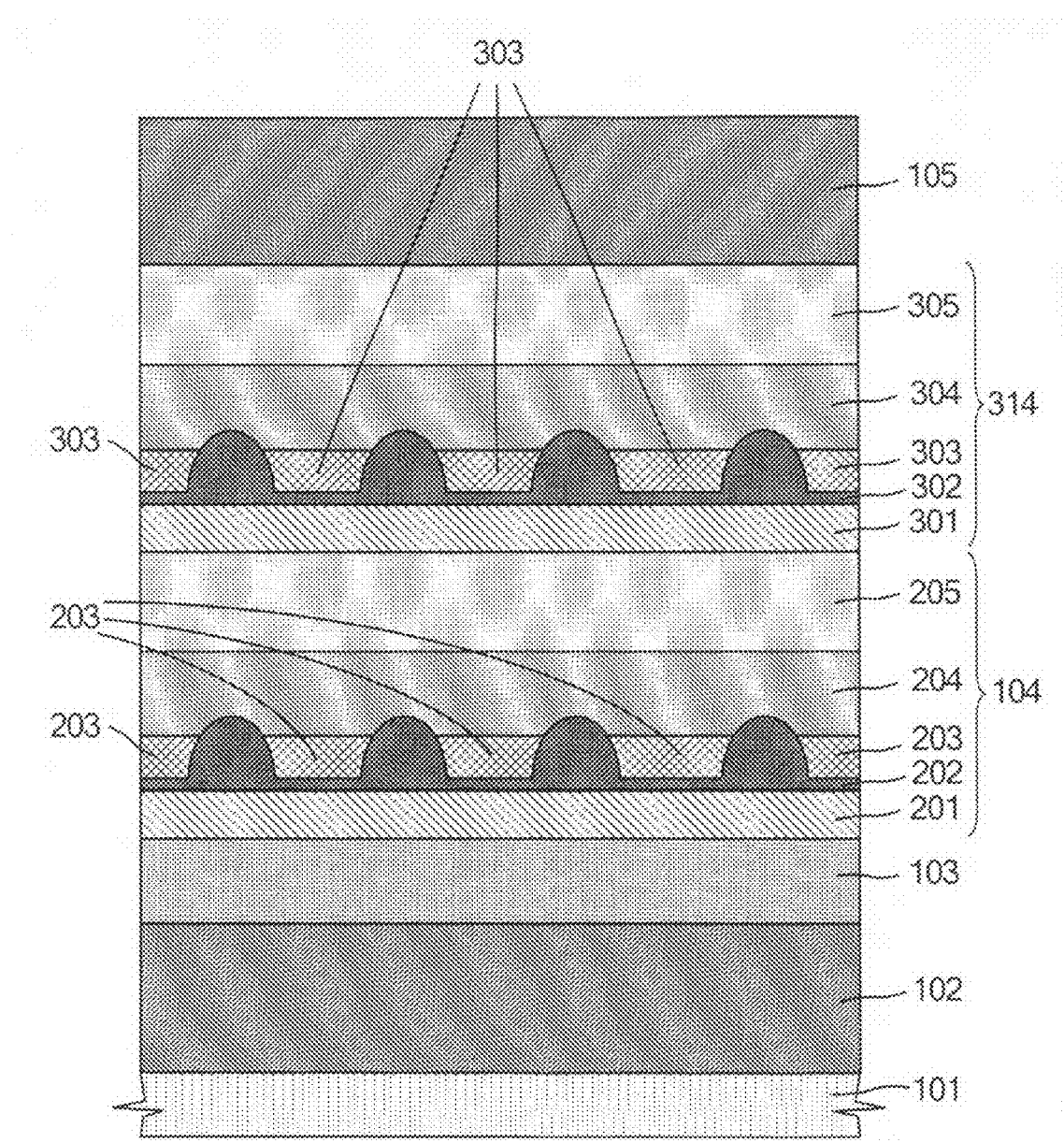
FIG. 3 shows a preferred embodiment of the invention for the quantum dot active layer having a plurality of quantum dot layers.

As shown in FIG. 3, a quantum dot active layer 314 is added on the existing active layer 104. The quantum dot active layer 314 comprises the first quantum well layer 301, a quantum dot layer 302 formed on the first quantum well layer 301, a confinement enhancing layer 303 formed on the quantum dot layer 302, a second quantum well layer 304 formed on the confinement enhancing layer 303, a barrier layer 305 formed on the second quantum well layer 304, and a second contact layer 105 formed on the barrier layer 305.

Thus, a plurality of quantum dot layers can be added in the quantum dot infrared photodetector of the invention, such as the active layer 104 or the quantum dot active layer 314 is added between the barrier layer and the contact layer. In the invention, about 3 layers to 100 layers of quantum dot layers can be added totally.

Figure 4:
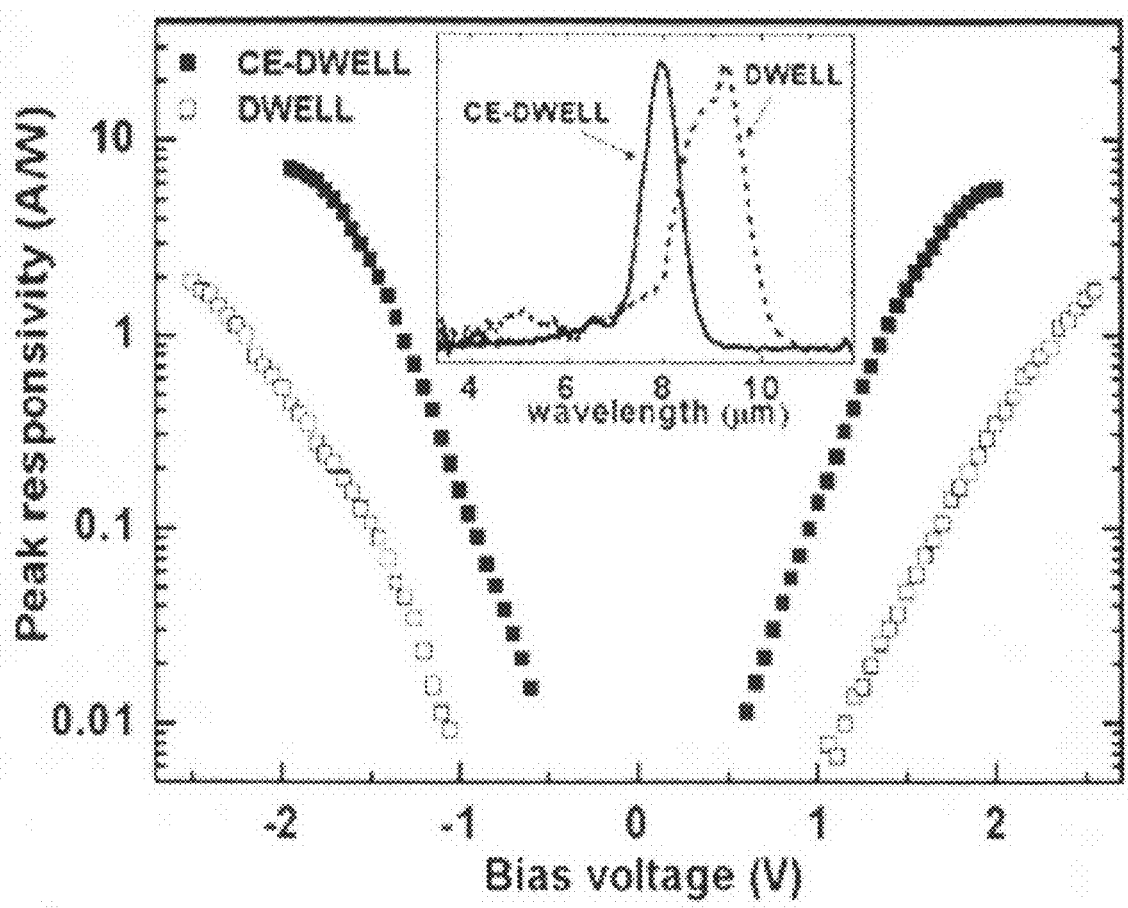
FIG. 4 shows the comparison curves of the invention and the prior art.

As shown in FIG. 4, the curves of bias voltage versus peak responsivity are drawn. Compared to the existed technology for the quantum dot infrared photodetector, the invention can raise the quantum efficiency to about 20 times. The quantum efficiency of common quantum dot photodetector is less than 1%, and the invention can improve it by an order of magnitude to several percentages. The invention can increase the signal/noise ratio of detecting signal. It can raise the sensitivity of infrared detection under the same working temperature, or raise the working temperature under the same sensitivity. The working temperature of the invention can reach 200 K compared to the typical absolute temperature of 77 K (boiling temperature of liquefied nitrogen).

The major application of the invention is used to detect the black body radiation of object itself, which means the object under room temperature can be detected without the existence of any light source. The invention is used in military applications mainly at early stage, which can be used for the object detection in the battle space, hot tracing missile and early warning system in battlefield. With the progress of technology recently, the similar portable system which uses the basic principle of the invention can be applied to general security surveillance, fire monitoring and fire detection, specific gas discharge monitoring, and nondestructive inspection of semiconductor process and cancer cell detection.

The invention is mainly to improve the quantum dot structure of in the quantum well. The invention can add a high energy gap in quantum dot, so that the electrons in quantum dot will get a stronger quantum confinement effect. It can increase the infrared absorption efficiency of electrons, in order to improve the performance of component.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A quantum dot infrared photodetector apparatus, comprising:
   a semiconductor substrate;
   a first contact layer formed on the semiconductor substrate;
   a barrier layer formed on the first contact layer;
   a quantum dot active layer formed on the barrier layer, wherein the quantum dot active layer including:
      a first quantum well layer;
      a quantum dot layer formed on the first quantum well layer;
      a confinement enhancing layer formed on the quantum dot layer;
      a second quantum well layer formed on the confinement enhancing layer; and
      a barrier layer formed on the second quantum well layer; and
   a second contact layer formed on the barrier layer formed to form the quantum dot infrared photodetector apparatus.

2. The apparatus according to claim 1, wherein the semiconductor substrate comprises an undoped GaAs semiconductor substrate.

3. The apparatus according to claim 1, wherein a thickness of the barrier layer comprises about 10 nm to 150 nm.

4. The apparatus according to claim 1, wherein the barrier layer comprises an undoped GaAs layer.

5. The apparatus according to claim 1, wherein the barrier layer comprises an undoped AlGaAs layer.

6. The apparatus according to claim 5, wherein a content of aluminum in the undoped AlGaAs layer comprises about 0% to 35%.

7. The apparatus according to claim 1, wherein the first quantum well layer comprises an undoped InGaAs layer.

8. The apparatus according to claim 7, wherein a content of indium in the undoped InGaAs layer comprises about 0% to 20%.

9. The apparatus according to claim 1, wherein a thickness of the first quantum well layer comprises about 0 nm to 15 nm.

10. The apparatus according to claim 1, wherein a thickness of the confinement enhancing layer comprises about 0.5 nm to 5.0 nm.

11. The apparatus according to claim 1, wherein the confinement enhancing layer comprises an undoped AlGaAs layer.

12. The apparatus according to claim 11, wherein a content of aluminium in the undoped AlGaAs layer comprises 0% to 35%.

13. The apparatus according to claim 1, wherein the second quantum well layer comprises an undoped InGaAs layer.

14. The apparatus according to claim 13, wherein a content of indium in the undoped InGaAs layer comprises 0% to 20%.

15. The apparatus according to claim 1, wherein the barrier layer comprises an undoped GaAs layer.

16. The apparatus according to claim 1, wherein the barrier layer comprises an undoped AlGaAs layer.

17. The apparatus according to claim 16, wherein a content of aluminum in the undoped AlGaAs layer comprises about 0% to 35%.

18. A quantum dot infrared photodetector apparatus, comprising:
a semiconductor substrate;
a first contact layer formed on the semiconductor substrate;
a barrier layer formed on the first contact layer;
a quantum dot active layer formed on the barrier layer, wherein the quantum dot active layer including:
a first quantum well layer;
a quantum dot layer formed on the first quantum well layer;
a confinement enhancing layer formed on the quantum dot layer;
a second quantum well layer formed on the confinement enhancing layer; and
a barrier layer formed on the second quantum well layer;
a plurality of the quantum dot active layers formed on the barrier layer; and
a second contact layer formed on the plurality of the quantum dot active layers to form the quantum dot infrared photodetector apparatus.

19. The apparatus according to claim 18, wherein the semiconductor substrate comprises an undoped GaAs semiconductor substrate.

20. The apparatus according to claim 18, wherein a thickness of the barrier layer comprises about 10 nm to 150 nm.

21. The apparatus according to claim 18, wherein the barrier layer comprises an undoped GaAs layer.

22. The apparatus according to claim 18, wherein the barrier layer comprises an undoped AlGaAs layer.

23. The apparatus according to claim 22, wherein a content of aluminum in the undoped AlGaAs layer comprises about 0% to 35%.

24. The apparatus according to claim 18, wherein the first quantum well layer comprises an undoped InGaAs layer.

25. The apparatus according to claim 18, wherein a content of indium in the undoped InGaAs layer comprises about 0% to 20%.

26. The apparatus according to claim 18, wherein a thickness of the first quantum well layer comprises about 0 nm to 15 nm.

27. The apparatus according to claim 18, wherein a thickness of the confinement enhancing layer comprises about 0.5 nm to 5.0 nm.

28. The apparatus according to claim 18, wherein the confinement enhancing layer comprises an undoped AlGaAs layer.

29. The apparatus according to claim 28, wherein a content of aluminium in the undoped AlGaAs layer comprises 0% to 35%.

30. The apparatus according to claim 18, wherein the second quantum well layer comprises an undoped InGaAs layer.

31. The apparatus according to claim 30, wherein a content of indium in the undoped InGaAs layer comprises 0% to 20%.

32. The apparatus according to claim 18, wherein the barrier layer comprises an undoped GaAs layer.

33. The apparatus according to claim 18, wherein the barrier layer comprises an undoped AlGaAs layer.

34. The apparatus according to claim 33, wherein a content of aluminium in the undoped AlGaAs layer comprises 0% to 35%.

35. A quantum dot active layer comprises:
a first quantum well layer formed on a barrier layer;
a quantum dot layer formed on the first quantum well layer;
a confinement enhancing layer formed on the quantum dot layer;
a second quantum well layer formed on the confinement enhancing layer; and
a barrier layer formed on the second quantum well layer.

36. The quantum dot active layer according to claim 35, wherein the quantum dot active layer is used in the quantum dot infrared photodetector apparatus.

37. The quantum dot active layer according to claim 35, wherein the first quantum well layer comprises an undoped InGaAs layer.

38. The quantum dot active layer according to claim 35, wherein a content of indium in the undoped InGaAs layer comprises about 0% to 20%.

39. The quantum dot active layer according to claim 35, wherein a thickness of the first quantum well layer comprises about 0 nm to 15 nm.

40. The quantum dot active layer according to claim 35, wherein a thickness of the confinement enhancing layer comprises about 0.5 nm to 5.0 nm.

41. The quantum dot active layer according to claim 35, wherein the confinement enhancing layer comprises an undoped AlGaAs layer.

42. The quantum dot active layer according to claim 41, wherein a content of aluminium in the undoped AlGaAs layer comprises 0% to 35%.

43. The quantum dot active layer according to claim 35, wherein the second quantum well layer comprises an undoped InGaAs layer.

44. The quantum dot active layer according to claim 43, wherein a content of indium in the undoped InGaAs layer comprises 0% to 20%.

45. The quantum dot active layer according to claim 35, wherein the barrier layer comprises an undoped GaAs layer.

46. The quantum dot active layer according to claim 35, wherein the barrier layer comprises an undoped AlGaAs layer.

47. The quantum dot active layer according to claim 46, wherein a content of aluminum in the undoped AlGaAs layer comprises about 0% to 35%.

* * * * *